(12) United States Patent
Zhang

(10) Patent No.: US 11,700,739 B2
(45) Date of Patent: Jul. 11, 2023

(54) DISPLAY SUBSTRATE, MANUFACTURING METHOD THEREOF, AND DISPLAY DEVICE

(71) Applicant: BOE TECHNOLOGY GROUP CO., LTD., Beijing (CN)

(72) Inventor: Can Zhang, Beijing (CN)

(73) Assignee: BOE TECHNOLOGY GROUP CO., LTD., Beijing (CN)

(*) Notice: Subject to any disclaimer, the term of this patent is extended or adjusted under 35 U.S.C. 154(b) by 0 days.

(21) Appl. No.: 17/557,351

(22) Filed: Dec. 21, 2021

(65) Prior Publication Data

US 2022/0115622 A1 Apr. 14, 2022

Related U.S. Application Data

(63) Continuation of application No. 16/063,951, filed as application No. PCT/CN2017/112927 on Nov. 24, 2017, now Pat. No. 11,233,215.

(30) Foreign Application Priority Data

May 24, 2017 (CN) .......................... 201710373488.6

(51) Int. Cl.
*H10K 50/818* (2023.01)
*H10K 50/82* (2023.01)
(Continued)

(52) U.S. Cl.
CPC ........... *H10K 50/818* (2023.02); *H10K 50/82* (2023.02); *H10K 50/852* (2023.02); *H10K 59/38* (2023.02); *H10K 71/00* (2023.02)

(58) Field of Classification Search
None
See application file for complete search history.

(56) References Cited

U.S. PATENT DOCUMENTS

| 7,973,319 B2 | 7/2011 | Kashiwabara et al. |
| 8,847,857 B2 | 9/2014 | Liu et al. |

(Continued)

FOREIGN PATENT DOCUMENTS

| CN | 1868240 A | 11/2006 |
| CN | 102610630 A | 7/2012 |

(Continued)

OTHER PUBLICATIONS

First Chinese Office Action dated Apr. 19, 2022; Appln. No. 202011232028.X.

(Continued)

*Primary Examiner* — Michelle Mandala

(57) ABSTRACT

A display substrate, a manufacturing method thereof, and a display device are provided. The display substrate includes: a base substrate; an anode structure, disposed on the base substrate; a light emitting layer, disposed on a side of the anode structure away from the base substrate; and a cathode layer, disposed on a side of the light emitting layer away from the base substrate, the anode structure includes a reflective layer and an inorganic layer disposed on a side of the reflective layer away from the base substrate, the cathode layer includes a transflective layer, and the inorganic layer is configured to adjust a distance between the reflective layer and the transflective layer.

18 Claims, 4 Drawing Sheets

(51) Int. Cl.
*H10K 50/852* (2023.01)
*H10K 59/38* (2023.01)
*H10K 71/00* (2023.01)

(56) References Cited

U.S. PATENT DOCUMENTS

| | | | |
|---|---|---|---|
| 9,595,573 B2* | 3/2017 | Adachi | ............... H01L 51/5237 |
| 10,134,824 B2 | 11/2018 | Yan et al. | |
| 11,233,215 B2* | 1/2022 | Zhang | ................. H01L 51/5265 |
| 2007/0015429 A1 | 1/2007 | Maeda et al. | |
| 2013/0038640 A1 | 2/2013 | Kajimoto | |
| 2013/0140533 A1 | 6/2013 | Lee et al. | |
| 2014/0332779 A1 | 11/2014 | Lin | |
| 2015/0187858 A1 | 7/2015 | Wang et al. | |
| 2016/0343788 A1 | 11/2016 | Zou et al. | |
| 2017/0040388 A1 | 2/2017 | Yan et al. | |
| 2017/0309859 A1 | 10/2017 | Lee et al. | |
| 2018/0197923 A1 | 7/2018 | Kashiwabara et al. | |

FOREIGN PATENT DOCUMENTS

| | | |
|---|---|---|
| CN | 102956838 A | 3/2013 |
| CN | 103000638 A | 3/2013 |
| CN | 103441136 A | 12/2013 |
| CN | 103928495 A | 7/2014 |
| CN | 104143559 A | 11/2014 |
| CN | 104538428 A | 4/2015 |
| CN | 104600097 A | 5/2015 |
| CN | 104733506 A | 6/2015 |
| CN | 105489632 A | 4/2016 |
| CN | 105493288 A | 4/2016 |
| CN | 106098954 A | 11/2016 |
| CN | 107204400 A | 9/2017 |

OTHER PUBLICATIONS

International Search Report and Written Opinion dated Feb. 26, 2018; PCT/CN2017/112927.
The First Chinese Office Action dated Jun. 4, 2018; Appln. No. 2017103734886.
Non-Final Office Action dated Apr. 27, 2021 in connection with U.S. Appl. No. 16/063,951.
USPTO NOA dated Sep. 17, 2021 in connection with U.S. Appl. No. 16/063,951.

* cited by examiner

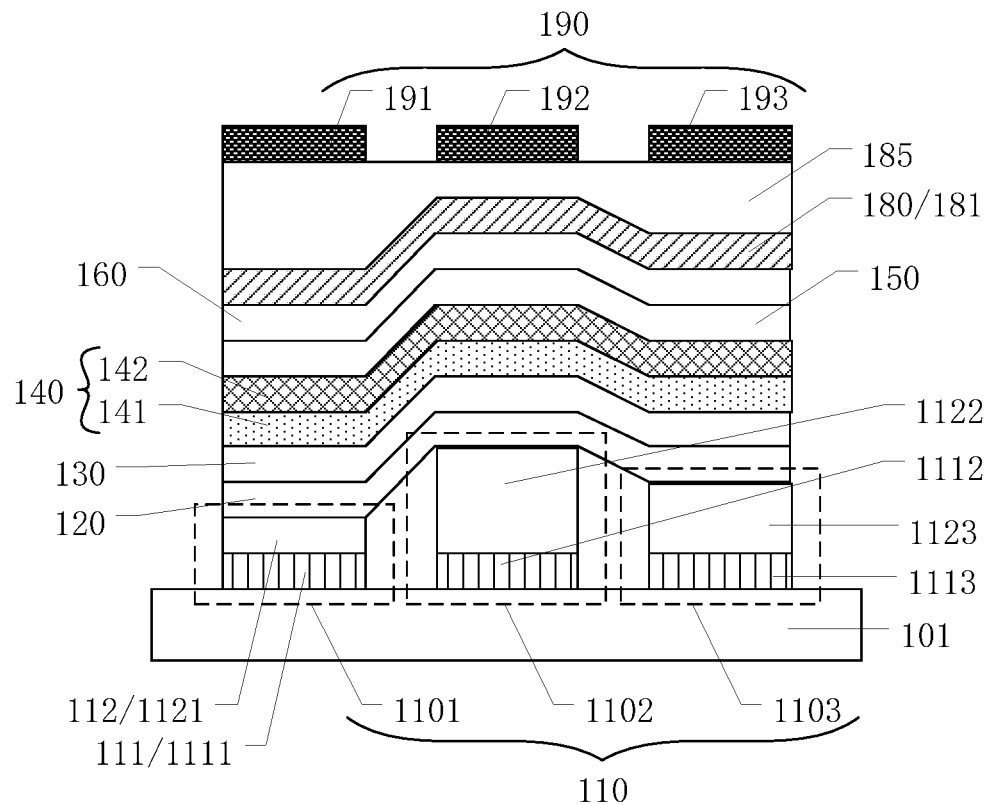

Fig. 3

| forming an anode structure on a base substrate, the anode structure including a reflective layer and an inorganic layer disposed on a side of the reflective layer away from the base substrate | S201 |
|---|---|
| forming a light emitting layer on a side of the anode structure away from the base substrate | S202 |
| forming a cathode layer on a side of the light emitting layer away from the base substrate, the cathode layer includes a transflective layer, and the inorganic layer can adjust the distance between the reflective layer and the transflective layer | S203 |

Fig. 4

DISPLAY SUBSTRATE, MANUFACTURING METHOD THEREOF, AND DISPLAY DEVICE

CROSS-REFERENCE TO RELATED APPLICATION

This application is a continuation of U.S. Ser. No. 16/063,951 filed on Jun. 19, 2018, which is a national stage application of international application PCT/CN2017/112927 filed on Sep. 24, 2017, which claims priority from China Patent application No. 201710373488.6 filed on May 24, 2017, the disclosures of all of these applications hereby incorporated herein by reference in their entirety.

TECHNICAL FIELD

Embodiments of the present disclosure relate to a display substrate, a manufacturing method thereof, and a display device.

BACKGROUND

Organic Light Emitting Diode (OLED) display devices have become a research hotspot due to their advantages such as self-luminescence, high contrast, thin thickness, wide viewing angle, fast response speed, flexibility, and wide operating temperature range.

In addition, with the continuous development of wearable technology, micro display devices have a vast market application space. For example, a micro display device can be used to a helmet display device, a glasses-type display, and the like. The micro display device can obtain accurate image information at anywhere and anytime by linking together with mobile communication networks, satellite positioning system, or the like, thereby having a relatively wide application prospect.

SUMMARY

At least one embodiment of the present disclosure provides a display substrate, which includes: a base substrate; an anode structure, disposed on the base substrate; a light emitting layer, disposed on a side of the anode structure away from the base substrate; and a cathode layer, disposed on a side of the light emitting layer away from the base substrate, the anode structure includes a reflective layer and an inorganic layer disposed on a side of the reflective layer away from the base substrate, the cathode layer includes a transflective layer, and the inorganic layer is configured to adjust a distance between the reflective layer and the transflective layer.

For example, in the display substrate provided by an example of the present embodiment, the distance between the reflective layer and the transflective layer satisfies: $D=j(\lambda/2n)$, wherein D is the distance between the reflective layer and the transflective layer, $\lambda$ is a wavelength of light of a predetermined color, and n is an effective refraction index of a medium between the reflective layer and the transflective layer, and j is a positive integer.

For example, in the display substrate provided by an example of the present embodiment, the anode structure includes a first anode structure, a second anode structure, and a third anode structure, which are disposed on the base substrate at intervals, the first anode structure includes a first reflective layer and a first inorganic layer disposed on the first reflective layer, the second anode structure includes a second reflective layer and a second inorganic layer disposed on the second reflective layer, the third anode structure includes a third reflective layer and a third inorganic layer disposed on the third reflective layer, and the first inorganic layer, the second inorganic layer, and the third inorganic layer have different thicknesses.

For example, in the display substrate provided by an example of the present embodiment, the display substrate includes a plurality of sub pixels, and the plurality of sub pixels are disposed in a one-to-one correspondence with the first to third anode structures, and the sub pixel corresponding to the first anode structure is configured to emit light of a first color, the sub pixel corresponding to the second anode structure is configured to emit light of a second color, and the sub pixel corresponding to the third anode structure is configured to emit light of a third color; a wavelength of light of the first color is $\lambda1$, a wavelength of light of the second color is $\lambda2$, and a wavelength of light of the third color is $\lambda3$; a distance D1 between the first reflective layer of the first anode structure and the transflective layer, a distance D2 between the second reflective layer of the second anode structure and the transflective layer, and a distance D3 between the third reflective layer of the third anode structure and the transflective layer satisfy: $D1=j_1(\lambda_1/2n)$, $D2=j_2(\lambda_2/2n)$ and $D3=j_3(\lambda_3/2n)$, wherein n is an effective refraction index of a medium between the reflective layer and the transflective layer, and $j_1$, $j_2$, and $j_3$ are positive integers.

For example, in the display substrate provided by an example of the present embodiment, $j_1=1$, $j_2=2$, and $j_3=3$.

For example, the display substrate provided by an example of the present embodiment further includes: a color filter layer, disposed on a side of the cathode layer away from the base substrate, wherein the color filter layer includes a first color filter block having a first color, a second color filter block having a second color, and a third color filter block having a third color, the first color filter block, the second color filter block, and the third color filter block respectively correspond to the first anode structure, the second anode structure, and the third anode structure.

For example, in the display substrate provided by an example of the present embodiment, the light emitting layer and the cathode layer each are disposed on an entirety of the first anode structure, the second anode structure, and the third anode structure.

For example, in the display substrate provided by an example of the present embodiment, the inorganic layer is further configured to protect the reflective layer.

For example, in the display substrate provided by an example of the present embodiment, a material of the inorganic layer includes molybdenum oxide or titanium nitride.

At least one embodiment of the present disclosure provides a manufacturing method of a display substrate, including: forming an anode structure on a base substrate, the anode structure including a reflective layer and an inorganic layer disposed on a side of the reflective layer away from the base substrate; forming a light emitting layer on a side of the anode structure away from the base substrate; and forming a cathode layer on a side of the light emitting layer away from the base substrate, the cathode layer includes a transflective layer, and the inorganic layer is configured to adjust a distance between the reflective layer and the transflective layer.

For example, in the manufacturing method of a display substrate provided by an example of the present embodiment, forming the anode structure on the base substrate includes: forming the reflective layer on the base substrate by a patterning process; and forming the inorganic layer on a side of the reflective layer away from the base substrate by a patterning process, an orthographic projection of the inorganic layer on the base substrate is completely overlapped with an orthographic projection of the reflective layer on the base substrate.

For example, in the manufacturing method of a display substrate provided by an example of the present embodiment, forming the anode structure on the base substrate includes: forming a first anode structure, a second anode structure and a third anode structure which are disposed on the base substrate at intervals, the first anode structure includes a first reflective layer and a first inorganic layer disposed on the first reflective layer, the second anode structure includes a second reflective layer and a second inorganic layer disposed on the second reflective layer, the third anode structure includes a third reflective layer and a third inorganic layer disposed on the third reflective layer, and the first inorganic layer, the second inorganic layer, and the third inorganic layer have different thicknesses.

For example, in the manufacturing method of a display substrate provided by an example of the present embodiment, forming the first anode structure, the second anode structure and the third anode structure on the base substrate includes: forming the first reflective layer, the second reflective layer, and the third reflective layer on the base substrate by a patterning process.

For example, in the manufacturing method of a display substrate provided by an example of the present embodiment, forming the first anode structure, the second anode structure and the third anode structure on the base substrate further includes: forming a first sub inorganic layer on a side of the first reflective layer, the second reflective layer and the third reflective layer away from the base substrate; forming a first photoresist pattern on a side of the first sub inorganic layer away from the base substrate, wherein the first photoresist pattern covers the first reflective layer and gaps among the first reflective layer, the second reflective layer, and the third reflective layer, and exposes the second reflective layer and the third reflective layer; forming a second sub inorganic layer on the first photoresist pattern and the first sub inorganic layer; forming a second photoresist pattern on a side of the second sub inorganic layer away from the base substrate, wherein the second photoresist pattern covers the first reflective layer, the third reflective layer, and the gaps among the first reflective layer, the second reflective layer, and the third reflective layer; forming a third sub inorganic layer on the second photoresist pattern and the second sub inorganic layer; and removing the first photoresist pattern and the second photoresist pattern through a development, wherein the first inorganic layer includes the first sub inorganic layer, the second inorganic layer includes the first sub inorganic layer, the second inorganic layer, and the third inorganic layer, the third inorganic layer includes the first sub inorganic layer and the second sub inorganic layer.

For example, in the manufacturing method of a display substrate provided by an example of the present embodiment, forming the first sub inorganic layer on a side of the first reflective layer, the second reflective layer and the third reflective layer away from the base substrate includes: forming an inorganic material layer on a side of the first reflective layer, the second reflective layer and the third reflective layer away from the base substrate; and patterning the inorganic material layer to form the first sub inorganic layer, an orthographic projection of the first sub inorganic layer on the base substrate is completely overlapped with an orthographic projection of the first reflective layer, the second reflective layer, and the third reflective layer on the base substrate.

For example, in the manufacturing method of a display substrate provided by an example of the present embodiment, a material of the reflective layer includes aluminum or silver.

For example, in the manufacturing method of a display substrate provided by an example of the present embodiment, a material of the inorganic layer includes molybdenum oxide or titanium nitride.

At least one embodiment of the present disclosure provides a display device, including the any one of the above-mentioned display substrates.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

FIG. 3 is a schematic structural diagram of another display substrate provided by an embodiment of the present disclosure;

FIG. 4 is a flow diagram of a manufacturing method of a display substrate provided by an embodiment of the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. "Connected" and "connecting" and the similar terms are not limited to physical or mechanical connection, and they also include electrical connection, direct connection or indirect connection.

Figure 1:
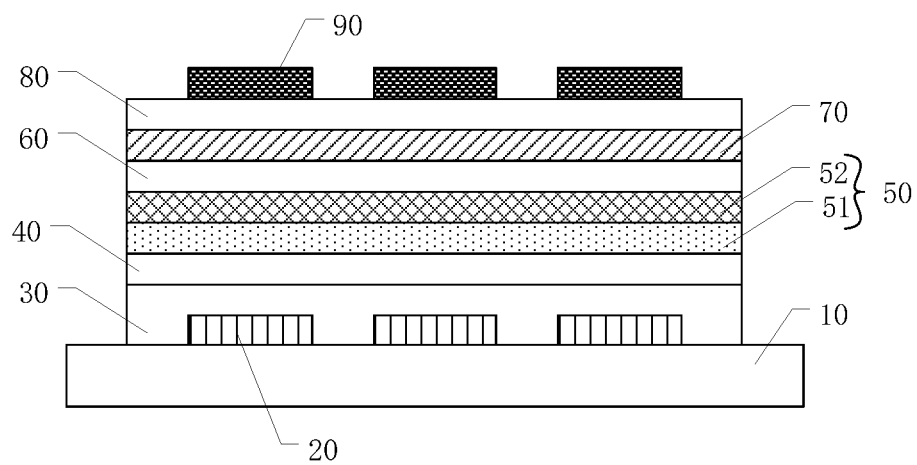
FIG. 1 is a schematic structural diagram of a display substrate.

Organic Light Emitting Diode (OLED) display devices occupy an important position in micro display device filed due to their unique advantages. Due to the limitation of Fine Metal Mask (FMM), conventional OLED display device cannot achieve high PPI (Pixel Per Inch). Therefore, upon an OLED display device being used as a micro display device, the OLED display adopts a structure of white light+color film. FIG. 1 is a schematic structural diagram of an OLED display device adopting a structure of white light+color film. As illustrated by FIG. 1, the OLED display device includes a base substrate 10, an anode 20 disposed on the base substrate 10, a hole injection layer 30 disposed on a side of the anode 20 away from the base substrate 10, and a hole transport layer 40 disposed on a side of the hole injection layer 30 away from the base substrate 10, an organic light emitting layer 50 disposed on a side of the hole transport layer 40 away from the base substrate 10, an electron transport layer 60 disposed on a side of the organic light emitting layer 50 away from the base substrate 10, a cathode 70 disposed on a side of the electron transport layer 60 away from the base substrate 10, an encapsulation layer 80 disposed on a side of the cathode 70 away from the base substrate 10, and a color filter layer 90 disposed on a side of the encapsulation layer 80 away from the base substrate 10. The organic light emitting layer 50 can emit white light, for example, the organic light emitting layer 50 can include a first sub organic light emitting layer 51 emitting orange-red light and a second sub organic light emitting layer 52 emitting blue-green light. The color filter layer 90 can include a plurality of color filter blocks having different colors, such as a color filter block having red color, a color filter block having green color, and a color filter block having blue color, and the color filter blocks are disposed in a one-to-one correspondence with the anodes, so that white light emitted from the organic light emitting layer 50 can display color after being filtered by the color filter layer 90. Because the anode and the color filter blocks can be manufactured through a mask process, the OLED display device can achieve a relatively high PPI. However, the color gamut of the abovementioned OLED display adopting the structure of white light+color film is reduced.

Embodiments of the present disclosure provide a display substrate, a manufacturing method of the same, and a display device. The display substrate includes a base substrate, an anode structure provided on the base substrate, a light emitting layer provided on a side of the anode structure away from the base substrate, and a cathode layer provided on a side of the light emitting layer far from the base substrate. The anode structure includes a reflective layer and an inorganic layer disposed on a side of the reflective layer away from the substrate. The cathode layer includes a transflective layer, and the inorganic layer is configured to adjust the distance between the reflective layer and the transflective layer. Thus, the reflective layer and the transflective layer can constitute a micro cavity effect structure, and the distance between the reflective layer and the transflective layer can be adjusted by an additional inorganic layer, thereby narrowing the luminescence spectrum of the sub pixel corresponding to the anode structure, so as to further improve the color purity.

Hereinafter, the display substrate, the manufacturing method thereof, and the display device provided by embodiments of the present disclosure will be described with reference to the accompanying drawings.

Figure 2:
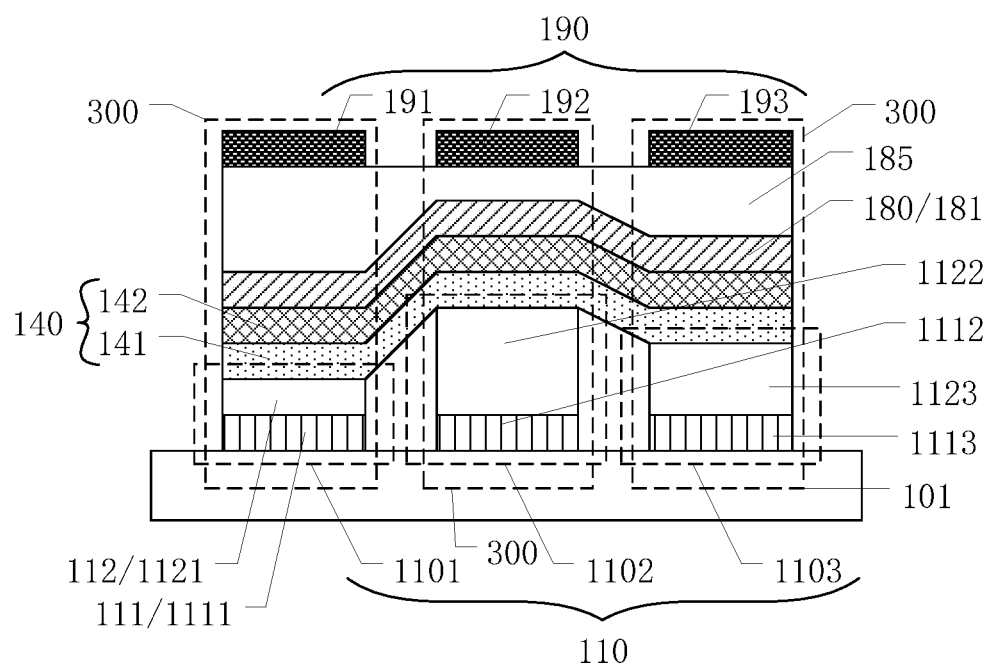
FIG. 2 is a schematic structural diagram of a display substrate provided by an embodiment of the present disclosure.

An embodiment of the present disclosure provides a display substrate. FIG. 2 is a schematic structural diagram of a display substrate according to the present embodiment. As illustrated by FIG. 2, the display substrate includes a base substrate 101, an anode structure 110 disposed on the base substrate 101, a light emitting layer 140 disposed on a side of the anode structure 110 away from the base substrate 101, and a cathode layer 180 disposed at a side of the light emitting layer 140 away from the base substrate 101. The anode structure 110 includes a reflective layer 111 and an inorganic layer 112 disposed on a side of the reflective layer 111 away from the base substrate 101; the cathode layer 180 includes a transflective layer 181. For example, as illustrated by FIG. 2, the cathode layer 180 itself can be the transflective layer. The inorganic layer 112 can adjust the distance between the reflective layer 111 and the transflective layer 181. It should be noted that the cathode layer itself can be a transflective layer, or can be additionally provided with a transflective layer, the embodiments of the present disclosure are not limited thereto. In addition, the abovementioned reflective layer can be an anode in an anode structure, or can be a reflective layer which is additionally provided on the anode. In a case where the reflective layer is an anode in an anode structure, the anode can be made of a metallic material such as silver or aluminum. In addition, the light emitting layer can be an organic light emitting layer.

In the display substrate provided in the present embodiment, the reflective layer in the anode structure and the transflective layer in the cathode layer can constitute a micro cavity effect structure, and the light emitting layer disposed between the anode structure and the cathode layer can be electroluminescent. The light directly emitted by the light emitting layer and the light reflected by the reflective layer can interfere with each other in the abovementioned micro cavity effect structure; light with a specific wavelength or a specific wavelength range can enhanced by adjusting the distance between the reflective layer and the transflective layer through the inorganic layer which is additionally provided, and light with other wavelengths is weakened, so that the luminescence spectrum of the sub pixel corresponding to the anode structure can be narrowed, thereby improving the color purity. Upon the display substrate provided in the present embodiment being applied to an OLED display device having a structure of white light plus a color filter, the color gamut of the OLED display can be improved under the premise of having a relatively high PPI by increasing the color purity of every sub pixels.

For example, in the display substrate provided in an example of the present embodiment, the distance between the reflective layer and the transflective layer satisfies a following formula: $D=j(\lambda/2n)$, where D is the distance between the reflective layer and the transflective layer, $\lambda$ is a wavelength of light of a predetermined color, n is an effective refractive index of a medium between the reflective layer and the transflective layer, and j is a positive integer. It should be noted that: the effective refractive index of the medium between the reflective layer and the transflective layer refers to an effective refractive index of the layer medium (e.g., an organic layer, an organic light emitting layer, and a hole transport layer, etc.) between the reflective layer and the transflective layer. Thus, the display substrate can adjust the distance between the reflective layer and the transflective layer by adjusting the thickness of the additionally provided inorganic layer to make the distance between the reflective layer and the transflective layer satisfy the abovementioned formula; such that light of a predetermined color is enhanced while the light of other colors is weakened, thereby improving the color purity. It should be noted that: the effective refractive index of the medium between the reflective layer and the transflective layer refers to an effective refractive index of the layers (e.g., an organic layer, an organic light emitting layer, and a hole transport layer, etc.) serving as an entirety between the reflective layer and the transflective layer. For example, the effective refractive index can be measured experimentally or calculated.

For example, supposing that the medium between the reflective layer and the transflective layer includes four layer structures whose thickness and refractive index respectively are respectively d1, n1; d2, n2; d3, n3; d4, n4, and the effective refractive index of the medium between the reflective layer and transflective layer can be equal to (d1·n1+d2·n2+d3·n3+d4·n4)/(d1+d2+d3+d4).

For example, the predetermined color can be red, green or blue; of course, embodiments of the present disclosure include but are not limited thereto.

For example, in the display substrate provided in an example of the present embodiment, as illustrated by FIG. 2, the anode structure can include a first anode structure 1101, a second anode structure 1102, and a third anode structure 1103; the first anode structure 1101, the second anode structure 1102, and the third anode structure 1103 which are disposed on the base substrate 101 at intervals. The first anode structure 1101 includes a first reflective layer 1111 and a first inorganic layer 1121 disposed on a side of the first reflective layer 1111 away from the base substrate 101: the second anode structure 1102 includes a second reflective layer 1112 and a second inorganic layer 1122 disposed on a side of the second reflective layer 1112 away from the base substrate 101; the third anode structure 1103 includes a third reflective layer 1113 and a third inorganic layer 1123 disposed at a side of the third reflective layer 1113 away from the base substrate 101; and the thicknesses of the first inorganic layer 1121, the second inorganic layer 1122, and the third inorganic layer 1123 are different. Therefore, the sub pixels corresponding to the first anode structure, the second anode structure, and the third anode structure can respectively emit different light with higher color purity, so that the OLED display device using the display substrate has a relatively high color gamut.

For example, in the display substrate provided by an example of the present embodiment, as illustrated by FIG. 2, the display substrate includes a plurality of sub pixels 300. The plurality of sub pixels 300 are disposed in one-to-one correspondence with the anode structures 110, and the sub pixel corresponding to the first anode structure 1101 is configured to emit light of a first color, the sub pixel corresponding to the second anode structure 1102 is configured to emit light of a second color, and the sub pixel corresponding to the third anode structure 1103 is configured to emit light of a third color. The wavelength of the light of the first color is $\lambda_1$, the wavelength of the light of the second color is $\lambda_2$, and the wavelength of the light of the third color is $\lambda_3$, the distance between the first reflective layer of the first anode structure and the transflective layer is D1, the distance between the second reflective layer of the second anode structure and the transflective layer is D2, and the distance between the third reflective layer of the third anode structure and the transflective layer is D3 respectively satisfy: $D1=j_1(\lambda_1/2n)$, $D2=j_2(\lambda_2/2n)$ and $D3=j_3(\lambda_3/2n)$, where n is the effective refractive index of the medium between the reflective layer and the transflective layer, and $j_1$, $j_2$, and $j_3$ are positive integers.

For example, the sub pixel corresponding to the first anode structure emits red light with high color purity, the sub pixel corresponding to the second anode structure emits green light with high color purity, and the sub pixel corresponding to the third anode structure emits blue light with high color purity.

For example, in a sub pixel corresponding to the first anode structure, the distance between the first reflective layer and the transflective layer can satisfy the following formula: $D1=j_1(\lambda_1/2n)$, where D1 is the distance between the first reflective layer and the transflective layer, $\lambda_1$ is the wavelength of red light, n is the effective refractive index of the medium between the first reflective layer and the transflective layer, and $j_1$ is a positive integer. Thus, the sub pixel corresponding to the first anode structure emits red light with high color purity.

For example, the wavelength of red light can be selected to be 620 nm. The effective refractive index of the medium between the first reflective layer and the transflective layer can be selected to be 1.8, and D1 can be calculated to be 172 $j_1$ nanometers.

For example, in the sub pixel corresponding to the second anode structure, the distance between the second reflective layer and the transflective layer can satisfy the following formula: $D2=j_2(\lambda_2/2n)$, D2 is the distance between the second reflective layer and the transflective layer, $\lambda_2$ is the wavelength of green light, n is the effective refractive index of the medium between the second reflective layer and the transflective layer, and $j_2$ is a positive integer. Thus, the sub pixel corresponding to the second anode structure emits green light with high color purity.

For example, the wavelength of red light can be selected to be 520 nm, and the effective refractive index of the medium between the first reflective layer and the transflective layer can be selected to be 1.8, and D2 can be calculated as 144 $j_2$ nm.

For example, in the sub pixel corresponding to the third anode structure, the distance between the third reflective layer and the transflective layer can satisfy the following formula: $D3=j_3(\lambda_3/2n)$, wherein, D3 is the distance between the third reflective layer and the transflective layer, $\lambda_3$ is the wavelength of blue light, n is the effective refractive index of the medium between the third reflective layer and the transflective layer, and $j_3$ is a positive integer. Thus, the sub pixel corresponding to the third anode structure emits blue light with high color purity.

For example, the wavelength of red light can be selected to be 460 nm, and the effective refractive index of the medium between the first reflective layer and the transflective layer can be selected to be 1.8, and D3 can be calculated as 127 $j_3$ nm.

For example, in the display substrate provided by an example of the present embodiment, as illustrated by FIG. 2, the display substrate further includes a color filter layer 190 disposed on a side of the cathode layer 180 away from the base substrate 101. The color filter layer 190 includes a first color filter block 191 having a first color (e.g., red color), a second color filter block 192 having a second color (e.g., green color), and a third color filter block 193 having a third color (e.g., blue color). The first color filter block 191, the second color filter block 192, and the third color filter block 193 are respectively disposed corresponding to the first anode structure 1101, the second anode structure 1102, and the third anode structure 1103. Therefore, the first color filter block can filter out the light emitted by the light emitting layer corresponding to the first anode structure except the light of the first color, the second color filter block can filter out the light emitted by the light emitting layer corresponding to the second anode structure except the light of the second color, and the third color filter block can filter out the light emitted by the light emitting layer corresponding to the third anode structure except the light of the third color, thereby further enhancing the color purity of the sub pixels respectively corresponding to the first, second, and third anode structures. It should be noted that the color filter layer can be provided or not provided, and the embodiment of the present disclosure is not limited thereto.

For example, in the display substrate provided in an example of the present embodiment, as illustrated by FIG. 2, the light emitting layer 140 and the cathode layer 180 are continuously disposed on the first anode structure 1101, the second anode structure 1102, and the third anode structure 1103, respectively. That is, the light emitting layer 140 and the cathode layer 180 are disposed on an entirety of the first anode structure 1101, the second anode structure 1102, and the third anode structure 1103. Thus, the light emitting layer 140 can be directly formed by using an open mask instead of using a fine metal mask (FMM). On the one hand, the display substrate does not need to be formed by using a fine metal mask (FMM), which saves costs; on the other hand, the PPI of the display substrate is also relatively high.

For example, as illustrated by FIG. 2, the light emitting layer 140 includes a first sub light emitting layer 141 and a second sub light emitting layer 142. The first sub light emitting layer 141 can emit orange-red light through electroluminescence, and the second sub light emitting layer 142 can emit blue-green light through electroluminescence. Thus, the entire light emitting layer emits white light. Of course, the embodiments of the present disclosure include, but are not limited thereto, and the light emitting layer can also be other structures as long as white light can be emitted. For example, the light emitting layer can include three sub light emitting layers that emit red light, green light, and blue light, respectively.

For example, in the display substrate provided in an example of the present embodiment, as illustrated by FIG. 2, the inorganic layer 112 is disposed on the side of the reflective layer 111 away from the base substrate 101. The inorganic layer 112 can also serve as a protective layer of the reflective layer 111 for protecting the reflective layer.

For example, in the display substrate provided in an example of the present embodiment, molybdenum oxide can be used as the material of the inorganic layer. On the one hand, molybdenum oxide is convenient for etching and patterning; on the other hand, molybdenum oxide can also be used as a hole injection layer, so that an additional hole injection layer is not need to be provided.

For example, as illustrated by FIG. 2, the display substrate further includes an encapsulation layer 185 disposed between the cathode layer 180 and the color filter layer 190 for adhering the color filter layer 190 to the display substrate.

FIG. 3 is a schematic structural diagram of another display substrate according to the present embodiment. As illustrated by FIG. 3, the display substrate further includes an electron stop layer 120 disposed between the anode structure 110 and the light emitting layer 140 for blocking electrons, thereby improving the stability of the display substrate.

For example, as illustrated by FIG. 3, the display substrate further includes a hole transport layer 130 disposed between the electron stop layer 120 and the light emitting layer 140 for transporting holes to the light emitting layer.

For example, as illustrated by FIG. 3, the display substrate further includes a hole stop layer 150 and an electron transport layer 160 disposed between the light emitting layer 140 and the cathode layer 180.

For example, in the display substrate provided in an example of the present embodiment, the electron stop layer, the hole transport layer, the hole stop layer, and the electron transport layer can be continuously disposed on the first anode structure, the second anode structure, and the third anode structure, respectively. That is, the electron stop layer, the hole transport layer, the hole stop layer, and the electron transport layer can be disposed on an entirety of the first anode structure, the second anode structure, and the third anode structure. As a result, the electron stop layer, the hole transport layer, the hole stop layer, and the electron transport layer can be directly formed by using an open mask without using a fine metal mask (FMM). On the one hand, the display substrate does not need to be manufactured by using a fine metal mask (FMM), which saves costs; on the other hand, the PPI of the display substrate is also relatively high.

An embodiment of the present disclosure provides a manufacturing method of a display substrate. FIG. 4 is a flow diagram of a manufacturing method of a display substrate according to the present embodiment. As illustrated by FIG. 4, the manufacturing method of the display substrate includes the following steps S201 to S203.

Step S201: forming an anode structure on a base substrate, the anode structure including a reflective layer and an inorganic layer disposed on a side of the reflective layer away from the base substrate.

For example, the base substrate can employ a glass substrate, a quartz substrate, a plastic substrate, or other substrates.

Step S202: forming a light emitting layer on a side of the anode structure away from the base substrate.

For example, the light emitting layer can be an organic electroluminescent layer, and can include a plurality of sub light emitting layers, such as an orange-red light emitting layer and a blue-green light emitting layer, so as to emit white light.

Step S203: forming a cathode layer on a side of the light emitting layer away from the base substrate, the cathode layer includes a transflective layer, and the inorganic layer can adjust the distance between the reflective layer and the transflective layer.

For example, the cathode layer itself can be a transflective layer, or can be additionally provided with a transflective layer. The embodiments of the disclosure are not limited thereto.

In the manufacturing method of the display substrate provided in the present embodiment, the reflective layer in the anode structure formed on the base substrate and the transflective layer in the cathode layer can constitute a micro cavity effect structure, and the light emitting layer disposed between the anode structure and the cathode layer can be electroluminescent. The light directly emitted by the light emitting layer and the light reflected by the reflective layer can interfere with each other in the abovementioned micro cavity effect structure; light with a specific wavelength or a specific wavelength range can enhanced by adjusting the distance between the reflective layer and the transflective layer through the inorganic layer which is additionally provided, and light with other wavelengths is weakened, so that the luminescence spectrum of the sub pixel corresponding to the anode structure can be narrowed, thereby improving the color purity. In addition, because the light emitting layer can be used for emitting white light in the manufacturing method provided by the present embodiment, the light emitting layer can be manufactured only by an open mask, without using a fine metal mask (FMM), thereby saving the processes and reducing the costs.

For example, in the manufacturing method of a display substrate provided in an example of the present embodiment, the step S201 of forming an anode structure on a base substrate can include: forming a reflective layer on the base substrate by using a patterning process; and forming an inorganic layer on a side of the reflective layer away from the base substrate by using a patterning process, and an orthographic projection of the inorganic layer on the base substrate is completely overlapped with an orthographic projection of the reflective layer on the base substrate. Therefore, layers of the anode structure can be manufactured by using a mask process instead of a fine metal mask (FMM). Therefore, the number or density of the anode structures per unit area is relatively high, so that the display substrate manufactured by the manufacturing method provided by the present embodiment has a relatively high PPI. It should be noted that the abovementioned patterning process can be a masking process or a printing process, and the masking process can include steps of exposing, developing, etching, and the like.

For example, the reflective layer can be formed on the base substrate by using a sputtering process and a dry etching process.

For example, in the manufacturing method of a display substrate provided in an example of the present embodiment, forming an anode structure on a base substrate can include: forming a first anode structure, a second anode structure, and a third anode structure which are disposed on the base substrate at intervals, the first anode structure includes a first reflective layer and a first inorganic layer disposed on the first reflective layer, the second anode structure includes a second reflective layer and a second inorganic layer disposed on the second reflective layer, and the third anode structure includes a third reflective layer and a third inorganic layer disposed on the third reflective layer. The first inorganic layer, the second inorganic layer, and the third inorganic layer have different thicknesses. Therefore, the sub pixels corresponding to the first anode structure, the second anode structure, and the third anode structure can respectively emit different light with relatively high color purity, so that the display substrate manufactured by the manufacturing method of the display substrate provided by the present embodiment has a relatively high color gamut.

Figure 5A:
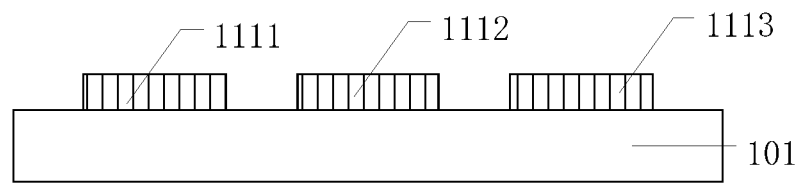
FIGS. 5a-5g are schematic diagrams of steps of a manufacturing method of a display substrate provided by an embodiment of the present disclosure.

For example, FIGS. 5a-5g are schematic diagrams of steps of a manufacturing method of a display substrate according to the present embodiment. As illustrated by FIG. 5a, in the manufacturing method of a display substrate provided in an example of the present embodiment, forming a first anode structure, a second anode structure, and a third anode structure on the base substrate includes: using a patterning process to form a first reflective layer 1111, a second reflective layer 1112, and a third reflective layer 1113 on the base substrate 101. Therefore, each of the reflective layers can be manufactured by using a mask process instead of a fine metal mask (FMM). Therefore, the number or density of the reflective layers per unit area is relatively high, so that the display substrate manufactured by the manufacturing method provided by the present embodiment has a relatively high PPI. It should be noted that: the first reflective layer, the second reflective layer, and the third reflective layer described above can also serve as the first anode, the second anode, and the third anode.

Figure 5B:
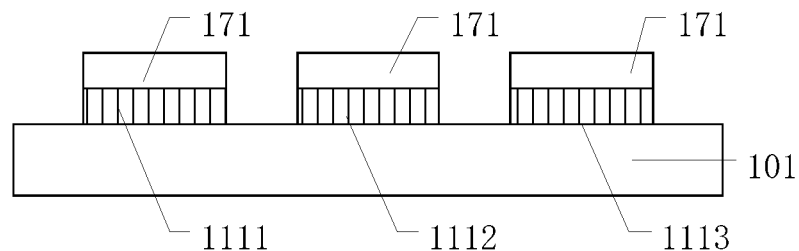
Figure 5C:
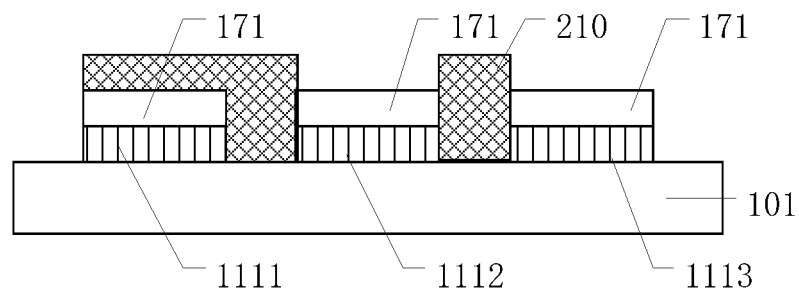
Figure 5D:
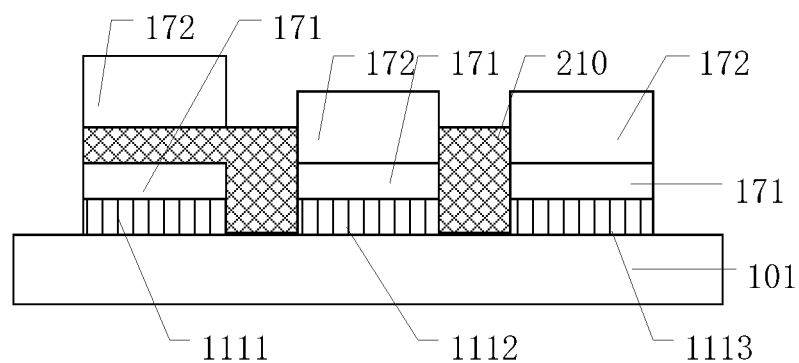
Figure 5E:
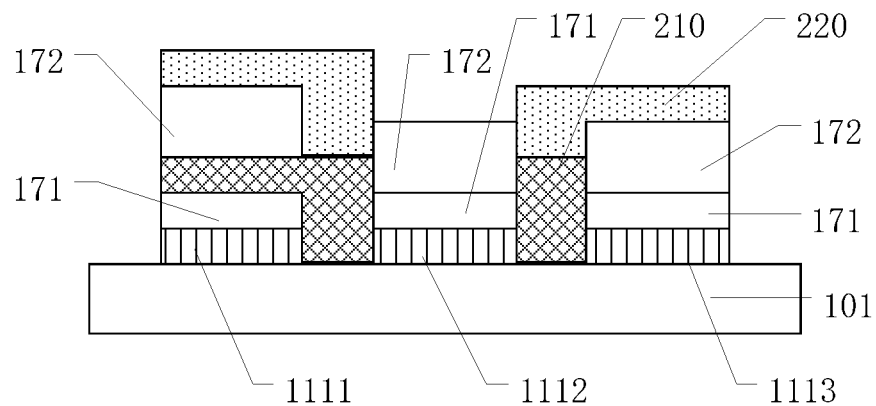
Figure 5F:
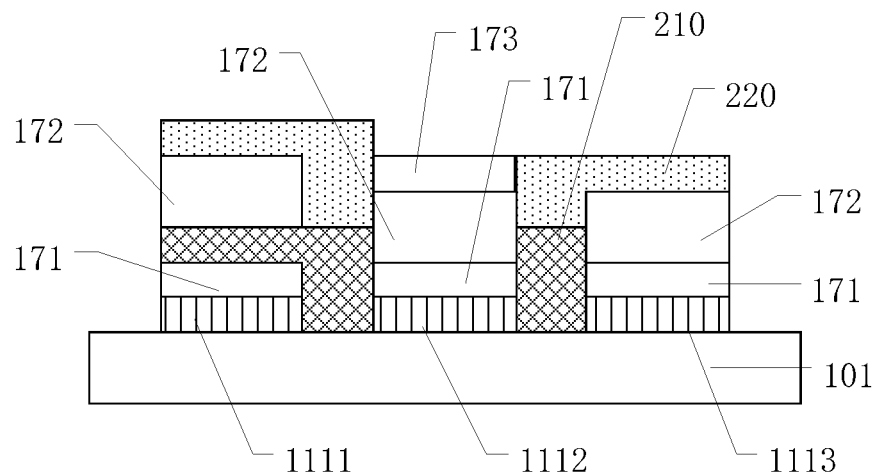
Figure 5G:
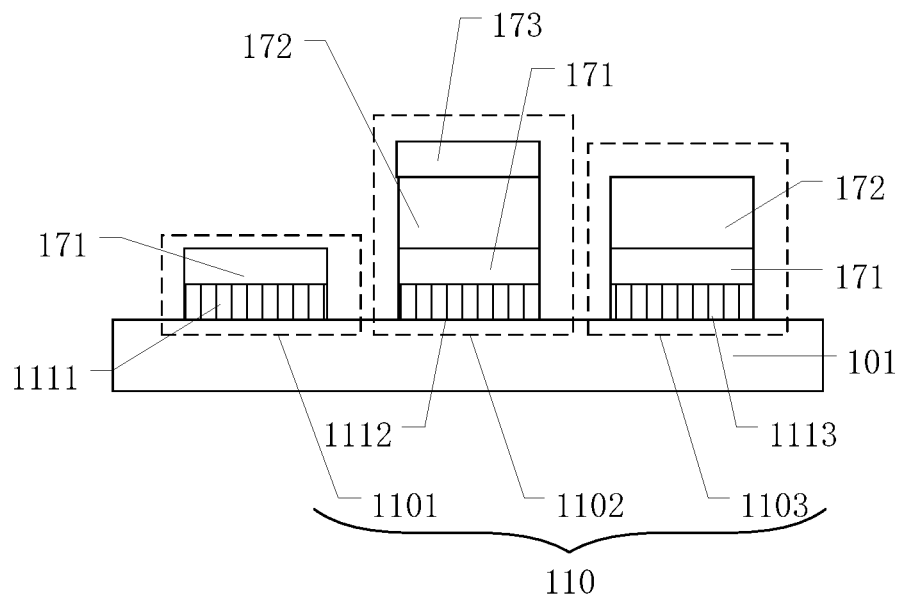

For example, in the manufacturing method of a display substrate provided in an example of the present embodiment, As illustrated by FIGS. 5b-5g, forming the first, second, and third anode structures on a base substrate further includes: as illustrated by FIG. 5b, forming a first sub inorganic layer 171 on a side of the first reflective layer 1111, the second reflective layer 1112, and the third reflective layer 1113 away from the base substrate 101. As illustrated by FIG. 5c, forming a first photoresist pattern 210 on a side of the first sub inorganic layer 171 away from the base substrate 101, and the first photoresist layer 210 covers the first reflective layer 1111 and gaps among the first reflective layer 1111, the second reflective layer 1112, and the third reflective layer 1113, and exposes the second reflective layer 1112 and the third reflective layer 1113; as illustrated by FIG. 5d, forming a second sub inorganic layer 172 on the first photoresist pattern 210 and the first sub inorganic layer 171; as illustrated by FIG. 5e, forming a second photoresist pattern 220 on a side of the second sub inorganic layer 172 away from the base substrate 101, the second photoresist pattern 220 covers the first reflective layer 1111, the third reflective layer 1113, and the gaps among the first reflective layer 1111, the second reflective layer 1112, and the third reflective layer 1113; as illustrated by FIG. 5f, forming a third sub inorganic layer 173 on the second photoresist pattern 220 and the second sub inorganic layer 172; as illustrated by FIG. 5g, removing the first photoresist pattern 210 and the second photoresist pattern 220 through a development, and removing a part of the second sub inorganic layer 172 and a part of the third sub inorganic layer 173 which are located directly above the first photoresist pattern 210 and the second photoresist pattern 220. In this situation, the first inorganic layer is the first sub inorganic layer 171, the second inorganic layer includes the first sub inorganic layer 171, the second inorganic layer 172, and the third inorganic layer 173, and the third inorganic layer includes the first sub inorganic layer 171 and the second sub inorganic layer 172. As a result, the first inorganic layer, the second inorganic layer, and the third inorganic layer having different thicknesses can be formed. It should be noted that, as illustrated by FIGS. 5c-5f, the first photoresist pattern 210 can also be filled in the gaps between the first reflective layer 1111, the second reflective layer 1112 and the third reflective layer 1113, and the second photoresist pattern 220 can also be filled in the gaps between the first reflective layer 1111, the second reflective layer 1112, and the third reflective layer 1113. Certainly, embodiments of the present disclosure include, but are not limited thereto, a pixel defining layer can be firstly formed among the first reflective layer, the second reflective layer, and the third reflective layer, and then the first photoresist pattern and the second photoresist pattern can be formed.

For example, in a case where the distance between the first reflective layer and the transflective layer is 172 $j_1$ nanometers, the distance between the second reflective layer and the transflective layer is 144 $j_2$ nanometers, and the distance between the third reflective layer and the transflective layer is 127 $j_3$ nanometers. Because the distance between the first reflective layer and the transflective layer is 172 $j_1$ nm, which is relatively large, the distance between the first reflective layer and the transflective layer can be applied as the first period, that is, $j_1=1$; the distance between the second reflective layer and the transflective layer and the distance between the third reflective layer and the transflective layer are relatively small, they can be applied as the second period, that is, $j_2=2$ and $j_3=3$. If the thickness of other layers (for example, the electron stop layer, the hole transport layer, the light emitting layer, the hole stop layer, and the electron transport layer) except the inorganic layer between the reflective layer and the transflective layer is 160 nm, then it can be calculated that the thickness of the first inorganic layer is 12 nm, the thickness of the second inorganic layer is 94 nm, and the thickness of the third inorganic layer is 120 nm. Thus, the thickness of the first sub inorganic layer is 12 nanometers, the thickness of the second sub inorganic layer is 82 nanometers, and the thickness of the third sub inorganic layer is 26 nanometers.

For example, in the manufacturing method of a display substrate provided in an example of the present embodiment, forming the first sub inorganic layer on a side of the first reflective layer, the second reflective layer, and the third reflective layer away from the base substrate includes: forming an inorganic material layer on a side of the reflective layer, the second reflective layer, and the third reflective layer away from the base substrate; and patterning the inorganic material layer to form a first sub inorganic layer, and an orthographic projection of the first sub inorganic layer on the base substrate is completely overlapped with an orthographic projection of the first reflective layer, the second reflective layer, and the third reflective layer on the base substrate.

For example, in the manufacturing method of a display substrate provided in an example of the present embodiment, the material of the reflective layer includes aluminum or silver. Thus, the reflective layer can also serve as a reflective layer as well as an anode.

For example, in the manufacturing method of a display substrate provided in an example of the present embodiment, the material of the inorganic layer includes molybdenum oxide or titanium nitride. On the one hand, molybdenum oxide is convenient for etching and patterning; on the other hand, molybdenum oxide can also be used as a hole injection layer, so that an additional hole injection layer can be not provided.

An embodiment of the present disclosure provides a display device including the display substrate described in any one of the abovementioned embodiments. Therefore, the display device can have a high color gamut under the premise of guaranteeing a relatively high PPI.

For example, the display device can be a micro display device such as a helmet display device and a glasses-type display device. Certainly, embodiments of the present disclosure include, but are not limited thereto, and the display device can also be an electronic device having a display function, such as: a notebook computer, a navigator, a television, a mobile phone, or the like.

The following points should to be explained:

(1) The accompanying drawings involve only the structure(s) in connection with the embodiment(s) of the present disclosure, and other structure(s) can be referred to common design(s).

(2) In the absence of conflict, the features of the same embodiment and the different embodiments can be combined with each other.

The foregoing is only the embodiments of the present invention and not intended to limit the scope of protection of the present invention, alternations or replacements which can be easily envisaged by any skilled person being familiar with the present technical field shall fall into the protection scope of the present disclosure. Thus, the protection scope of the present disclosure should be based on the protection scope of the claims.

What is claimed is:

1. A display substrate, comprising:
   a base substrate;
   an anode structure, disposed on the base substrate, comprising a first anode structure, a second anode structure and a third anode structure;
   an organic light emitting layer, disposed on a side of the anode structure away from the base substrate;
   a cathode layer, disposed on a side of the organic light emitting layer away from the base substrate,
   a color filter layer, disposed on a side of the cathode layer away from the base substrate, wherein the color filter layer comprises a first filter block of red color, a second filter block of green color and a third filter block of blue color, the first filter block, the second filter block and the third filter block are disposed respectively corresponding to the first anode structure, the second anode structure and the third anode structure;
   wherein the anode structure comprises a reflective layer, and a distance between the reflective layer in the second anode structure and the organic light emitting layer is greater than a distance between the reflective layer in the first anode structure and the organic light emitting layer,
   wherein an inorganic layer is between the reflective layer and the organic light emitting layer.

2. The display substrate according to claim 1, wherein the inorganic layer comprises a layer having a hole injection function.

3. The display substrate according to claim 1, wherein a total thickness of the inorganic layer between the reflective layer in the second anode structure and the organic light emitting layer is greater than a total thickness of the reflective layer.

4. The display substrate according to claim 1, wherein the organic light emitting layer is a continuous layer.

5. The display substrate according to claim 1, wherein the organic light emitting layer comprises a first sub organic light emitting layer and a second sub organic light emitting layer, and the first sub organic light emitting layer and the second sub organic light emitting layer are configured to emit light of different colors.

6. The display substrate according to claim 1, wherein the organic light emitting layer is configured to emit white light.

7. The display substrate according to claim 1, wherein at the second anode structure, the organic light emitting layer comprises a first slope part and a second slope part at edges of the second anode structure and comprises a flat part between the first slope part and the second slope part, and a slope angle of the first slope part and a slope angle of the second slope part are different at a same horizontal plane.

8. The display substrate according to claim 1, wherein an encapsulation layer is between the color filter layer and the organic light emitting layer, a distance H2 between a surface, close to the organic light emitting layer, of the encapsulation layer corresponding to the second anode structure and the reflective layer is greater than a distance H1 between a surface, close to the organic light emitting layer, of the encapsulation layer corresponding to the first anode structure and the reflective layer.

9. The display substrate according to claim 1, wherein a distance between the reflective layer in the second anode structure and the cathode layer is greater than a distance between the reflective layer in the first anode structure and the cathode layer.

10. The display substrate according to claim 1, wherein a material of the reflective layer comprises aluminum; and
    a material of the inorganic layer comprises titanium element.

11. The display substrate according to claim 1, wherein a material of the inorganic layer comprises molybdenum oxide or titanium nitride.

12. The display substrate according to claim 1, wherein a layer count of the inorganic layer is more than one, and a layer count of the cathode layer is more than one.

13. The display substrate according to claim 1, wherein the inorganic layer comprises a first sub inorganic layer, a second sub inorganic layer and a third sub inorganic layer.

14. A display substrate, comprising:
a base substrate;
an anode structure, disposed on the base substrate, comprising a first anode structure, a second anode structure and a third anode structure;
an organic light emitting layer, disposed on a side of the anode structure away from the base substrate;
a cathode layer, disposed on a side of the organic light emitting layer away from the base substrate,
a color filter layer, disposed on a side of the cathode layer away from the base substrate, wherein the color filter layer comprises a first filter block, a second filter block and a third filter block, the first filter block, the second filter block and the third filter block are disposed respectively corresponding to the first anode structure, the second anode structure and the third anode structure;
wherein at the second anode structure, the organic light emitting layer comprises a first slope part and a second slope part at edges of the second anode structure and comprises a flat part between the first slope part and the second slope part, and a slope angle of the first slope part and a slope angle of the second slope part are different at a same horizontal plane,
wherein a distance between the first slope part and the base substrate gradually decreases in a direction away from the flat part.

15. The display substrate according to claim 14, wherein the first filter block is a red filter block, the second filter block is a green filter block, and the third filter block is a blue filter block.

16. The display substrate according to claim 14, wherein a distance between the second slope part and the base substrate gradually decreases in a direction away from the flat part.

17. The display substrate according to claim 14, wherein a distance between the flat part and the reflective layer is greater than or equal to a distance between the first slope part and the reflective layer; and
the distance between the flat part and the reflective layer is greater than or equal to a distance between the second slope part and the reflective layer.

18. The display substrate according to claim 14, wherein an intersection of a tangent at a middle position of the first slope and a tangent at a middle position of the second slope is on a side of the reflective layer away from the base substrate.

* * * * *